(12) United States Patent
Klanke et al.

(10) Patent No.: US 11,191,179 B2
(45) Date of Patent: Nov. 30, 2021

(54) ARRANGEMENT AND METHOD FOR ESTABLISHING A GROUND CONNECTION BETWEEN A CIRCUIT CARD AND A HOUSING OF AN ELECTRICAL DEVICE

(71) Applicant: HARTING Electric GmbH & Co. KG, Espelkamp (DE)

(72) Inventors: Volker Klanke, Stemwede (DE); Christine Wulf, Diepenau (DE); Peter Doeding, Luebbecke (DE); Andreas Loesch, Duesseldorf (DE)

(73) Assignee: HARTING Electric GmbH & Co. KG

( * ) Notice: Subject to any disclaimer, the term of this patent is extended or adjusted under 35 U.S.C. 154(b) by 500 days.

(21) Appl. No.: 16/316,305

(22) PCT Filed: May 5, 2017

(86) PCT No.: PCT/DE2017/100386
§ 371 (c)(1),
(2) Date: Jan. 8, 2019

(87) PCT Pub. No.: WO2018/006892
PCT Pub. Date: Jan. 11, 2018

(65) Prior Publication Data
US 2021/0289651 A1    Sep. 16, 2021

(30) Foreign Application Priority Data

Jul. 8, 2016 (DE) ...................... 10 2016 112 571.7

(51) Int. Cl.
*H05K 7/14* (2006.01)

(52) U.S. Cl.
CPC ................................. *H05K 7/1417* (2013.01)

(58) Field of Classification Search
CPC ..................................................... H05K 7/1417
(Continued)

(56) References Cited

U.S. PATENT DOCUMENTS

| 4,855,873 A | 8/1989 | Bhargava et al. ............ 361/424 |
| 5,311,408 A | 5/1994 | Ferchau et al. ............... 361/818 |

(Continued)

FOREIGN PATENT DOCUMENTS

| CN | 1648820 | 8/2005 | ............... G06F 1/20 |
| CN | 201060078 | 5/2008 | ............... G01L 9/12 |

(Continued)

OTHER PUBLICATIONS

Chinese Office Action (w/machine translation) issued in application No. 201780042606.3, dated Mar. 3, 2020 (19 pgs).

(Continued)

*Primary Examiner* — Sherman Ng
(74) *Attorney, Agent, or Firm* — Hayes Soloway P.C.

(57) ABSTRACT

The ground connection between the circuit card and the housing and the housing connection side is implemented by at least one plug-in connection of variable insertion depth. This design is particularly advantageous for producing corresponding devices in an automated manner because, owing to the assembly of the devices, the contact-connection of the circuit card to ground also takes place automatically, specifically as desired in the advantageous form of meshed grounding with simultaneous compensation of the housing tolerances which is made possible by the plug-in connection of variable insertion depth.

18 Claims, 11 Drawing Sheets

Figure 1A:
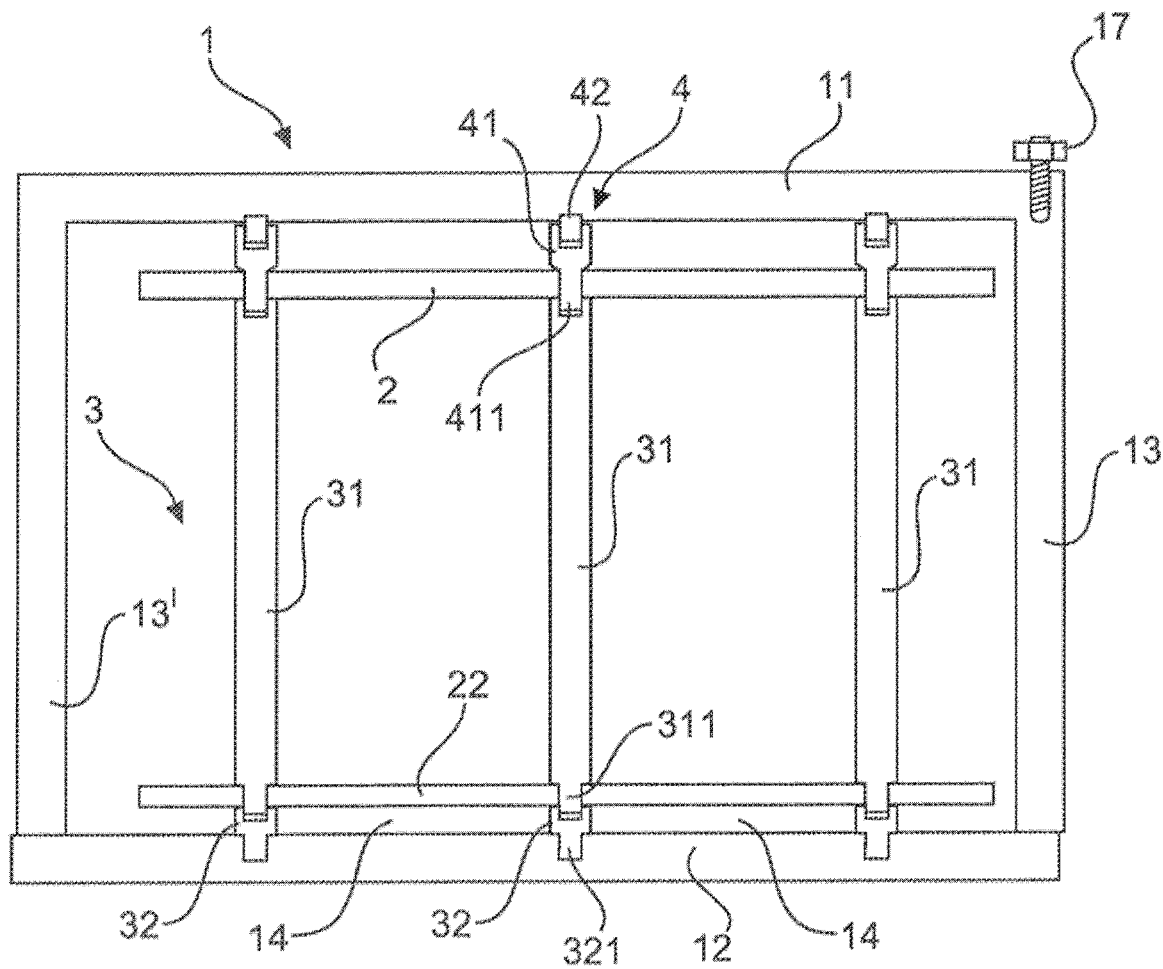

(58) Field of Classification Search
USPC .......................................................... 174/541
See application file for complete search history.

(56) References Cited

U.S. PATENT DOCUMENTS

| | | | | |
|---|---|---|---|---|
| 5,885,103 | A * | 3/1999 | Ernolf ................ | H01R 13/6592 439/579 |
| 5,893,761 | A * | 4/1999 | Longueville ......... | H01R 12/714 439/66 |
| 5,913,690 | A * | 6/1999 | Dechelette ......... | H01R 13/6582 439/108 |
| 7,369,415 | B2 | 5/2008 | Kojima ........................ | 361/789 |
| 7,813,142 | B2 | 10/2010 | Lin et al. ................. | H01R 9/00 |
| 2004/0034994 | A1 | 2/2004 | Chang ............................ | 20/760 |
| 2009/0020312 | A1 | 1/2009 | Lin et al. .................... | 174/126.1 |
| 2014/0211432 | A1 | 7/2014 | Lozano et al. ....... | H05K 7/1417 |
| 2015/0064943 | A1 | 3/2015 | Wright et al. ......... | H01R 12/71 |
| 2017/0018867 | A1* | 1/2017 | Kimura ............. | H01R 13/6581 |

FOREIGN PATENT DOCUMENTS

| | | | | |
|---|---|---|---|---|
| CN | 101350464 | | 1/2009 | ............. H01R 12/32 |
| CN | 102467183 | | 5/2012 | ............... G06F 1/18 |
| DE | 3529105 | | 2/1987 | ............. H01R 12/55 |
| DE | 9010251 | | 10/1990 | ............. H01R 12/58 |
| DE | 9106245 | | 8/1991 | ............... H05K 9/00 |
| DE | 9110871 | | 12/1991 | ............... H01R 4/64 |
| DE | 4326442 | | 2/1995 | ............... H05K 7/14 |
| DE | 69227690 | | 5/1999 | ............. H01R 13/10 |
| DE | 19833248 | | 2/2000 | ............... H05K 7/14 |
| DE | 10205816 | | 8/2003 | ............... H05K 5/00 |
| DE | 102005001146 | | 8/2005 | ............... H02G 3/16 |
| DE | I02004029820 | | 1/2006 | ............. B60R 21/01 |
| DE | 102011080170 | | 2/2013 | ............... H05K 5/02 |
| FR | 2557756 | | 7/1985 | ............... H05K 7/14 |

OTHER PUBLICATIONS

German Office Action (w/machine translation) issued in application No. 10 2016 112 571.7, dated Feb. 2, 2017 (8 pgs).
International Preliminary Report on Patentability issued in application No. PCT/DE2017/100386, dated Jan. 8, 2019 (16 pgs).
International Search Report and Written Opinion issued in application No. PCT/DE2017/100386, dated Oct. 13, 2017 (21 pgs).

* cited by examiner

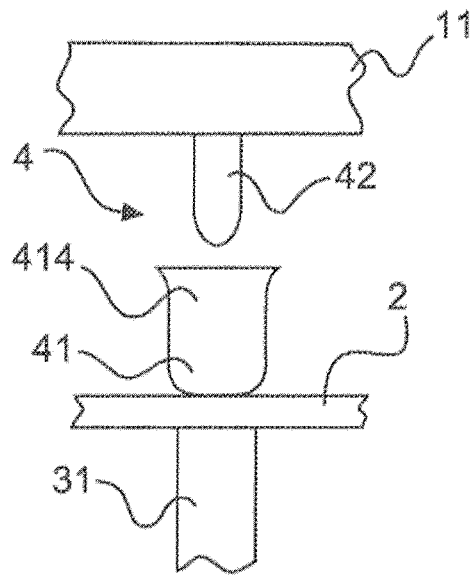
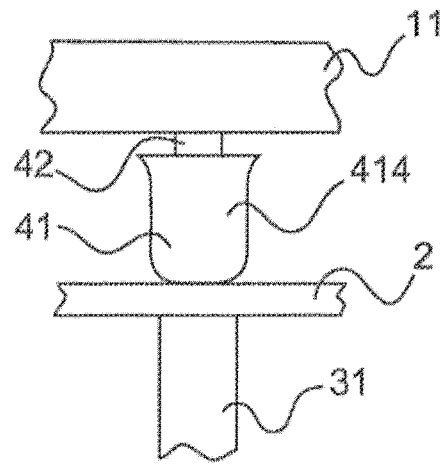
Fig.3a Fig.3b
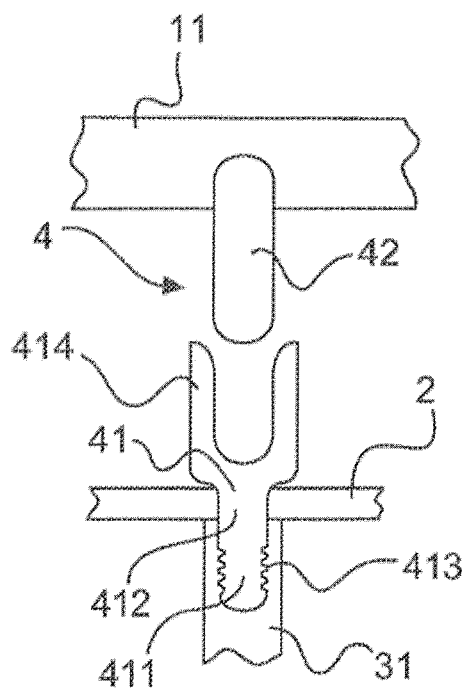
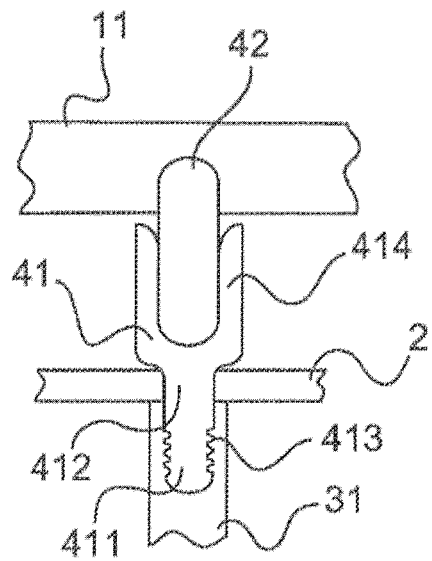
Fig.3c Fig.3d

ARRANGEMENT AND METHOD FOR ESTABLISHING A GROUND CONNECTION BETWEEN A CIRCUIT CARD AND A HOUSING OF AN ELECTRICAL DEVICE

In a first aspect, the invention starts with an arrangement for the ground connection of a printed circuit board to a frame of an electrical device according to the precharacterizing clause of the independent claim 1.

In a second aspect, the invention starts with a method for the ground connection of a printed circuit board to an at least partially electrically conductive frame of an electrical device.

Such arrangements and methods are required to prevent, or at least reduce, disturbance currents and related disturbance fields within electrical devices.

PRIOR ART

Various ground connections between printed circuit boards and electrically conductive frames of associated electrical devices are known in the prior art.

For example, establishing contact between a ground connection of a printed circuit board and a frame by means of a screw is known from printed document DE 90 10 251 U1.

Printed document DE 10 2004 029 820 A1 proposes a control device which has a frame which in turn consists of a frame cover with metallic inserts and a frame base. The metallic inserts are provided for the screw-connection of the frame base of a printed circuit board, which has electrical components located in the frame, and the frame cover. The screw-connection results in an electrical contact between the frame base and the printed circuit board and guarantees the functionally reliable transmission of the acceleration signals from the frame base to acceleration sensors on the printed circuit board.

Printed document DE 198 33 248 C2 discloses a device for the guidance and ground contacting of the lateral edges of a printed circuit board which is inserted into a device chassis forming the electrical ground. In this case, at least two opposing stamped sheet metal portions are provided in a sheet metal plate, which is adjacent to the lateral edges of the inserted printed circuit board and is directly a connecting part of the device chassis, which stamped sheet metal portions between them form a guide groove for the printed circuit board edge. Inserted between the stamped sheet metal portions is a ground spring, which is in direct galvanic contact with the sheet metal plate and abuts resiliently against the ground lamination of the printed circuit board via spring legs.

Printed document DE 43 26 442 A1 discloses a spacer for fastening a printed circuit board arranged between two walls of a frame. The spacer has a shoulder up to which it can be pressed into an opening in the printed circuit board in a positionally secure manner. It protrudes over the printed circuit board on both sides and abuts with a head against one wall and with a foot against the other wall of the frame.

Printed document US 2015/0064943 A1 discloses a securing structure for use with a stand-alone control unit. The control unit comprises a threaded insert, which is arranged in an enclosed cavity, which enables screws to be used for grounding an EMI/RFI printed circuit board along with forming a sealed and enclosed pocket. The securing structure enables grounding to a sheet metal base plate without forming a leak path to the outside of the control unit. This grounding approach encapsulates the screw to prevent a leak path from forming.

Printed document DE 102 05 816 A1 proposes a frame for an electrical device having at least one electronic circuit on a printed circuit board, which electronic circuit can be arranged in the frame. In this case, at least one wall, supported in the frame, is present, by means of which a virtually disturbance-radiation resistant chamber is formed after the frame parts are joined together and which is contacted by the ground connection of the printed circuit board. A least one contact spring, preferably a helical spring, is secured to the wall, which contact spring, when the device is assembled, which comes to lie with its one resilient end on a ground-connected contact surface of the printed circuit board and/or the frame.

The spring contacts known from the above-mentioned prior art, and in particular spring contacts which are soldered to the printed circuit board, are disadvantageous in that they take up valuable space on the printed circuit board. Furthermore, establishing contact between such a spring contact and the opposite side, in this case the second frame side, is also unreliable and problematic. A hard anodized coating is possibly also generated on the spring contact, which must be removed. Moreover, the corresponding machining and therefore the production of corresponding devices is very complex.

On the other hand, in many applications, there is a high demand for corresponding length adjustment with simultaneous ground contacting. With batched flow production of electrical devices, a considerable problem arises for example when the spacing between a printed circuit board, which contains for example the insulating body of the plug connector of the electrical device, and an adjacent frame side, namely a device connection side, varies from device to device within the normal frame tolerances. In particular, the ground connection of the printed circuit board to the device connection side is thus made considerably more difficult, which results in the generation of disturbance fields.

This variation in the spacing can come about, for example, in that the position of the said printed circuit board relative to a device base side, which is parallel to and opposite the device connection side of the frame, is fixedly predetermined by the design. In manufacturing terms, by adding together the tolerances of individual components of the frame, the spacing between the printed circuit board and the device connection side can vary from device to device by up to 1 mm, for example.

Of course, it is possible, and generally known in the prior art, to realize the ground connection in the form of cabling, for example via a grounding cable screwed to the device connection side, in order to thereby ensure a corresponding tolerance compensation and the necessary flexibility in terms of freely selecting the connection point on the frame and, in particular on, or close to, the device connection side. However, on the one hand, this is linked to an undesirably high level of manual involvement during production and, on the other, the disturbance currents flowing through the grounding cable extending in an uncontrolled manner can in turn cause detrimental and non-reproducible disturbance fields which are, in particular, difficult to predict.

In a further suboptimum variant, a ground connection of the printed circuit board could be diverted via the device base side, although this entails increasing the path of disturbance currents within the frame and therefore increasing the disturbance fields within the frame. In turn, however, this has a very detrimental effect on the signal integrity within the device, which may result in such device types no longer functioning without disturbance, or at least in it no longer being possible to ensure disturbance-free operation of such devices and these devices therefore not being approved, for example.

OBJECT

The object of the invention consists in overcoming the above-mentioned problems and providing a cost-efficient device which is produced with little effort and a corresponding method, which are suitable for preventing, or at least considerably reducing, such disturbance fields in electrical devices.

In a first aspect, this object is achieved with a device of the type mentioned at the outset by the features of the characterizing part of the independent claim 1.

In a second aspect, the object is achieved by a method having the features of the independent claim 12.

The arrangement for the ground connection of a printed circuit board to a frame of an electrical device comprises
- the frame, which consists at least partially of an electrically conductive material,
- the printed circuit board, which has at least one ground contact, and
- at least one ground connection for the electrically conductive connection of the at least one ground contact of the printed circuit board to the frame, wherein the at least one ground connection is formed in each case by a plug connection having a variable insertion depth.

The method for the ground connection of a printed circuit board to an at least partially electrically conductive frame of an electrical device comprises the following steps:

a.) securing at least one stabilizing element by its first end to a device base side of the frame;
b.) mechanically connecting the at least one stabilizing element at its second end to the printed circuit board;
c.) securing at least one first connecting part to the at least one stabilizing element with simultaneous fastening of the printed circuit board between the at least one first connecting part and the at least one stabilizing element, whilst simultaneously establishing electrical contact between at least one ground contact of the printed circuit board and the at least one first connecting part;
d.) securing at least one second connecting part to a device connection side of the frame;
e.) mechanically assembling the frame and simultaneously automatically electrically conductively connecting the frame to the at least one ground contact of the printed circuit board via at least one plug connection having a variable insertion depth between the at least one first and the at least one second connecting part, whilst simultaneously mechanically compensating deviating frame dimensions within a predetermined tolerance range by correspondingly adapting the insertion depth of the plug connection between the at least one first and the at least one second connecting part.

Advantageous configurations of the invention are described in the subclaims.

The invention relates to device and a method which serve to connect at least one ground contact of at least one printed circuit board and in particular a folded printed circuit board and/or a printed circuit board which belongs to an arrangement of a plurality of printed circuit boards to an electrically conductive frame of an electrical device in such a way that as few electrical and/or magnetic and/or electromagnetic disturbance fields as possible occur within the frame. This preferably relates to a frame which has at least four, preferably six, frame sides which are substantially parallel to and opposite one another in pairs. In particular, in this case, the device connection side and the device base side are parallel to and opposite one another. A folded printed circuit board in this case, and a printed circuit board below, is understood to have at least one folded area.

A particularly major advantage of the invention therefore consists in that relatively major electrical disturbances, which occur for example along a supply line in the form of voltage spikes induced for example by on and off switching procedures, cause only comparatively slight disturbance fields within the frame of the electrical device connected thereto since they are conducted to the device ground geometrically very close to their separation from the useful voltage which is carried out via electronic filters of the printed circuit board, for example. This is enabled in that, at such a suitable point, at least one electrically conductive ground connection between the printed circuit board and the frame is produced by a plug connection having a variable insertion depth.

Thus, geometric deviations, which inevitably arise namely during the production of the device as a result of varying frame dimensions, can be compensated within a predetermined tolerance range and the ground connection can take place on the device connection side on which the ground connection of the frame is preferably also arranged. This ground connection of the frame can be configured for example as a constituent part of the power connection or as a separate ground connection, e.g. in the form of a grounding screw.

A multiplicity of such ground connections preferably exists between the printed circuit board and the device connection side, wherein these ground connections can be distributed as homogenously as possible over the printed circuit board and therefore also over the device connection side. In each case, this enables a virtually optimum reduction in the path which an electrical disturbance, e.g. a voltage spike and the associated electrical current, generated at any point on the printed circuit board has to cover via the frame ground until it is discharged from the frame via the ground connection. At the same time, substantially automated batched flow production of corresponding devices is possible.

In general terms, the invention is therefore particularly advantageous for electrical devices wherein a printed circuit board is arranged in the frame at a predetermined spacing from a first frame side and is to be simultaneously brought into electrical ground contact with a second frame side which is parallel to and opposite the first frame side.

The invention is furthermore advantageous in that the production effort for such devices is reduced, since the ground contacting, even with a multiplicity of such ground connections, automatically takes place during the mechanical assembly of the frame.

The printed circuit board can be, in particular, a folded printed circuit board. A folded printed circuit board is understood to be a printed circuit board which has at least one folded area. This folded area can comprise at least one subarea, in particular a lower subarea, which, in terms of its function and arrangement, corresponds to a further printed circuit board provided in another configuration.

Therefore, particularly power-intensive components can be arranged on the lower subarea of a folded printed circuit board, for example. This lower subarea can be arranged very close to the device base side, for example at a spacing of $d<1$ mm from the device base side, i.e. a frame side which is typically arranged at the bottom in normal use, which enables very good heat dissipation via the frame, which is moreover promoted by interposed heat conducting elements.

In particular, the stabilizing element is a plurality of screwed-together screw bolts, of which, in particular, that screw bolt which is mounted in the device base side is shorter than the other screw bolts. It can thus be enabled that the folded area of the printed circuit board, in particular with its lower subarea, or the said further printed circuit board, is arranged very close to the device base side. For example, its spacing from the device base side can thus be less than 2 mm, for example 1 mm. This results in very good heat dissipation for electrical components, in particular particularly power-intensive electronic components, arranged thereon, in particular when heat conducting elements are additionally arranged on the device base side.

An upper subarea of the folded printed circuit board can be aligned parallel thereto on the opposite frame side, namely the device connection side. Both subareas can be fastened to the device base side via one, or preferably more, in particular multi-part stabilizing elements. The upper subarea of the folded printed circuit board can have the power connection and, for example, a power supply unit, in particular a switching power supply unit, and associated electrical input filters, wherein the input filters are provided for filtering out particularly high-frequency disturbance currents from the supply voltage and normally discharging them to frame ground. However, the power supply unit can also be arranged on a lateral area of the folded printed circuit board, in particular close to the ground connection.

Furthermore, the folded printed circuit board can have insulating bodies of further plug connectors, for example M12 sockets, in its upper subarea. In the installed state, these are integrated in the device connection side of the frame, in particular in associated sleeves, for example screw-in sleeves, wherein, in the assembled state of the device, the insulating bodies enter into the respective sleeve, wherein the entry depth is variable within the said frame tolerances.

Of course, this does not only apply to the folded printed circuit board with its sub-areas, which is mentioned by way of example here, but equally to arrangements having a plurality of stacked printed circuit boards, i.e. printed circuit boards arranged parallel to one another at a predetermined spacing, which are fastened to the device base side via the stabilizing element, for example. In particular, this can also refer to a multiplicity of stacked printed circuit boards. Furthermore, this can also refer to a folded printed circuit board combined with one or more stacked further printed circuit boards.

One of the printed circuit boards can have the power connection and the insulating body, for example, and therefore corresponds to the upper part of the folded printed circuit board.

However, compared to the use of two parallel printed circuit boards, the use of a folded printed circuit board is advantageous in that an electrical connecting device between the two printed circuit boards is possibly not required since, and in that, there instead exists a connecting area which can be fitted with electronic components, namely the lateral area.

The stabilizing element can comprise a plurality of parts, in particular screw bolts, which are fastened together for example through through-bores in the further printed circuit boards and/or the subareas of the folded printed circuit boards, in particular screwed together by means of associated threaded pins and hollow cylindrical threaded recesses. The further printed circuit boards and/or the folded area of the printed circuit board can thus be fastened to the stabilizing element at a predetermined spacing from one another. Depending on requirements, the further printed circuit boards and/or the folded area of the printed circuit board can also be electrically conductively connected to the device connection side at further ground contacts provided for this via the at least one stabilizing element and the plug connection; however, they can also simply be mechanically fastened to the at least one stabilizing element. In particular, the principle of a "meshed grounding" can therefore also be implemented by a multiplicity of stabilizing elements, ground connections and connecting parts, in which any disturbance, regardless of the point at which it is generated, automatically seeks its shortest path to zero potential. This principle is advantageous in that it can be used universally, i.e. regardless of the respective circuit design of the printed circuit board, and functions in a virtually optimum manner regardless of the geometric generation of the respective disturbance.

For this reason, an advantageous configuration provides that at least 3, in particular at least 4, in particular at least 6, in particular at least 8, in particular at least 9, in particular at least 12 or more ground contacts, with through-bores through which a first connecting part in each case is fastened to the device base side via one stabilizing element in each case, are provided in the printed circuit board, in the upper subarea of the folded printed circuit board or in the said (top) printed circuit board of the stacked arrangement (i.e. the printed circuit board adjacent to the device connection side). In particular, these ground contacts can be distributed as homogenously as possible on the printed circuit board surface in order to implement the principle of the meshed grounding as advantageously as possible.

The power connection of the electrical device is advantageously integrated in the device connection side and can be responsible both for the power supply to the power supply unit and for grounding the frame.

Alternatively or additionally, a separate ground connection, e.g. in the form of a ground connection screw, can be mounted on the frame. It is then particularly advantageous to arrange the grounding screw in the vicinity of the power connection and in particular also in the vicinity of the power supply unit, i.e. either on the device connection side in the vicinity of the power connection or on a side part in the vicinity of the device connection side and in particular in the vicinity of the power connection. In the latter case, it is of course advantageous if the device connection side is connected together with the sides part and in particular a plurality of side parts, preferably all side parts, in one piece, i.e. forms an upper part which is seated and secured, e.g. screwed, on the device base side when the device is assembled.

The stabilizing element is advantageously secured to the device base side of the frame and the second connecting part is electrically conductively secured to the device connection side of the frame, wherein the device connection side is parallel to and opposite the device base side in the assembled state. This simplifies the assembly of such a device considerably, since, when seating the device connection side on the further frame or seating the frame upper part on the device base side, for example, the, in particular, meshed ground connection of the electronics of the device to the frame thereof takes place automatically.

The first connecting part and the second connecting part can advantageously be connectable to one another with form and force fit for electrical contacting and can thus be capable of establishing electrical contact with one another.

In an advantageous configuration, one of the at least two connecting parts, preferably the first connecting part, can possess a base area and, opposite, a plug area. Its base area is then arranged on the ground contact of the printed circuit board and electrically conductively connected thereto. The base area can have a threaded pin or an internal thread. On the plug side, the first connecting part can preferably be configured to be socket shaped. For example, it can have a recess, which is constructed to be hollow cylindrical, at least in certain areas, and, in a preferred configuration, it possesses a funnel-shaped inlet area on the plug side. Furthermore, the connecting part can have slots extending in the plug-in direction on the plug side. For example, the first connecting part can be a tulip-head bolt.

The second connecting part can likewise have a plug and a base.

Compared to the preferably socket-shaped first connecting part, the second connecting part can fulfill the function of a pin contact on the plug side and can in turn be secured on the second frame side, and electrically conductively connected thereto, on the base side.

In an alternative configuration, the first connecting part could also represent a pin contact on the plug side and the second connecting part could assume the function of a socket contact opposite this.

It is therefore possible for either the first connecting part to be configured to be socket-shaped in its plug area and the second connecting part to fulfill the function of a pin contact opposite the first connecting part, or for the second connecting part to be configured to be socket-shaped in its plug area and for the first connecting part to fulfill the function of a pin contact opposite the second connecting part.

At least one of the two connecting elements is advantageously elastically deformable at least on its plug side. Therefore, one of the two connecting elements can be a tulip-head bolt and/or one of the two connecting elements can be a clamping pin or a clamping sleeve.

In particular, at least one of the two connecting elements is elastically deformable perpendicularly to the plug-in direction, i.e. in the radial direction. For example, the socket-shaped connecting part can be a tulip-head bolt, which is notable in that, in the area of its substantially hollow cylindrical recess, it has a slot starting on the plug side and extending in the direction of the base side, whereby resilient lugs for the force-fitting reception and electrical contacting of the pin contact are formed in its plug area.

However, it is alternatively or additionally also possible for the pin contact to be deformable in the radial direction. To this end, the pin contact can be constructed in the form of a clamping sleeve, a clamping pin or a spiral sleeve, for example. For example, it can be a hollow cylinder made from spring steel sheet with an axial slot, whereby the pin contact is radially deformable. However, it can also be a pin contact made from spring steel sheet, which resembles a spiral spring in cross-section.

The first connecting part advantageously possesses a base area at one end and, opposite, a plug area wherein the base area is arranged on the at least one ground contact of the printed circuit board and electrically conductively connected thereto.

At its at least one ground contact, the printed circuit board can have a through-opening through which the first connecting part can be mechanically fastened, in particular screwed, to the stabilizing element on the base side. To this end, the first connecting part can advantageously have a threaded pin in its base area, which is guided through the through-opening in order to be screwed in a hollow cylindrical threaded recess of a screw bolt belonging to the stabilizing element. Alternatively, the screw bolt can also have a threaded pin at this point, which is guided through the through-opening of the printed circuit board and screwed to a hollow cylindrical threaded recess of the first connecting part.

In particular, the stabilizing element can be a plurality of screwed-together screw bolts, wherein at least two of these screw bolts are screwed together through at least one further through-opening of a folded area of the printed circuit board and/or at least one further printed circuit board in order to mechanically fasten the folded area and/or the further printed circuit board. In this case, the folded area of the printed circuit board and/or the at least one further printed circuit board can have a further ground contact at at least one of the said further through-openings in order to also enable further ground contacting via the stabilizing element and the plug connection in addition to the said mechanical fastening.

In a preferred configuration, the frame has a respective cylindrical recess for securing each stabilizing element and each second connecting part in its device base side and in the device connection side. In particular, at least those recesses which are arranged in the device base side can each have an internal thread in order to screw a threaded pin of the respective stabilizing element therein. Those recesses which are arranged in the device connection side can likewise have an internal thread for screwing in the second connecting part, for example a tulip-head bolt or the base side of a contact pin. However, they can also be hollow cylindrical recesses without internal threads, which are provided for receiving a clamping pin or a clamping sleeve with force fit.

EXEMPLARY EMBODIMENT

Figure 1B:
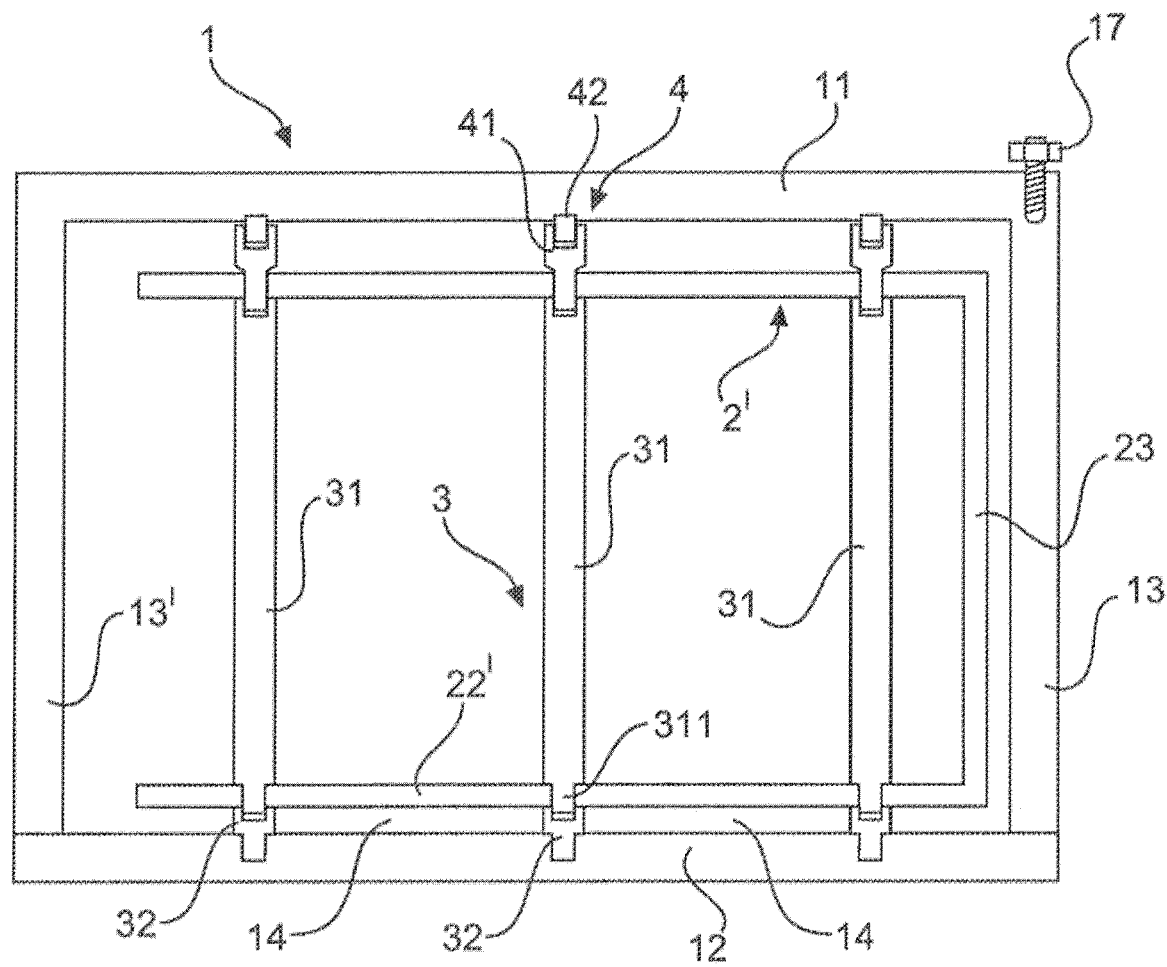
Figure 2A:
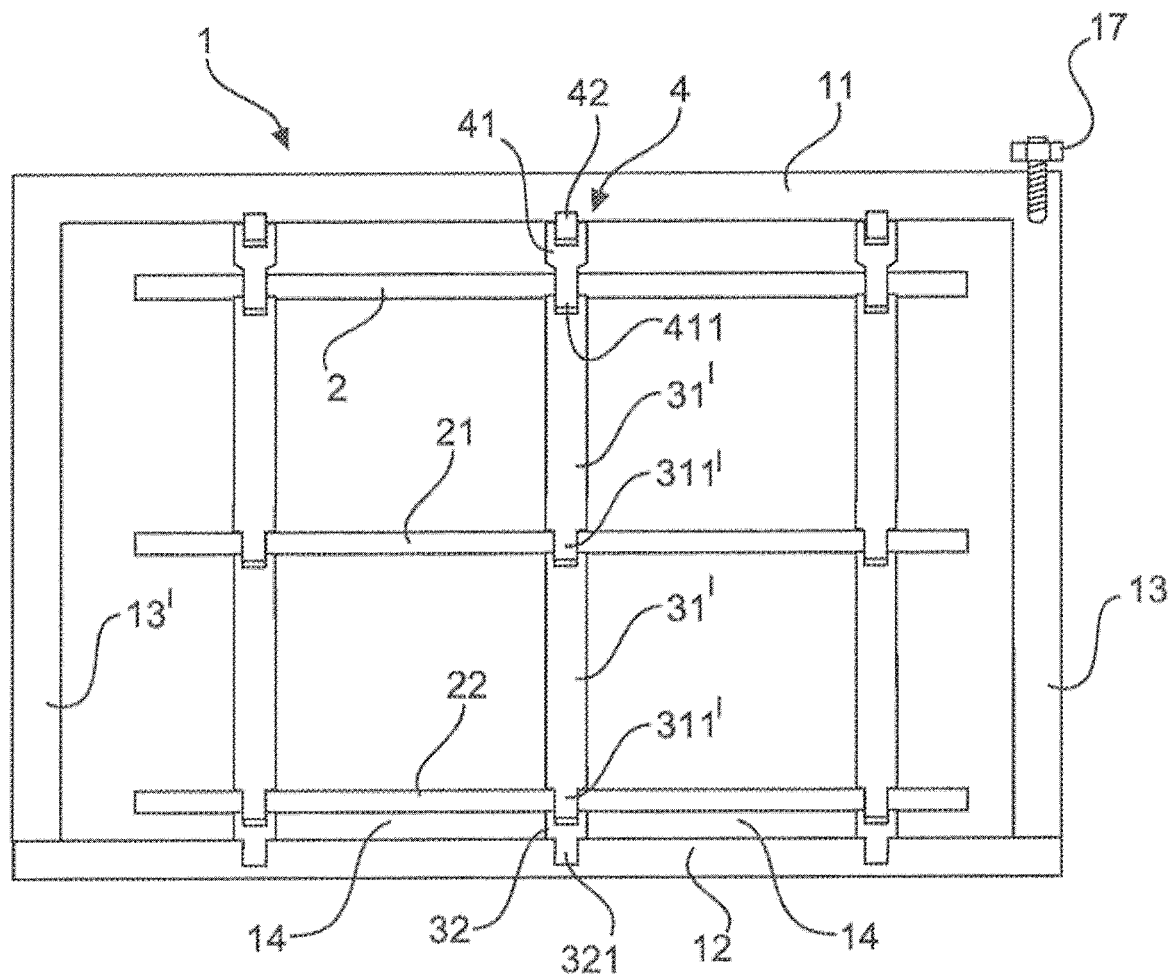
Figure 2B:
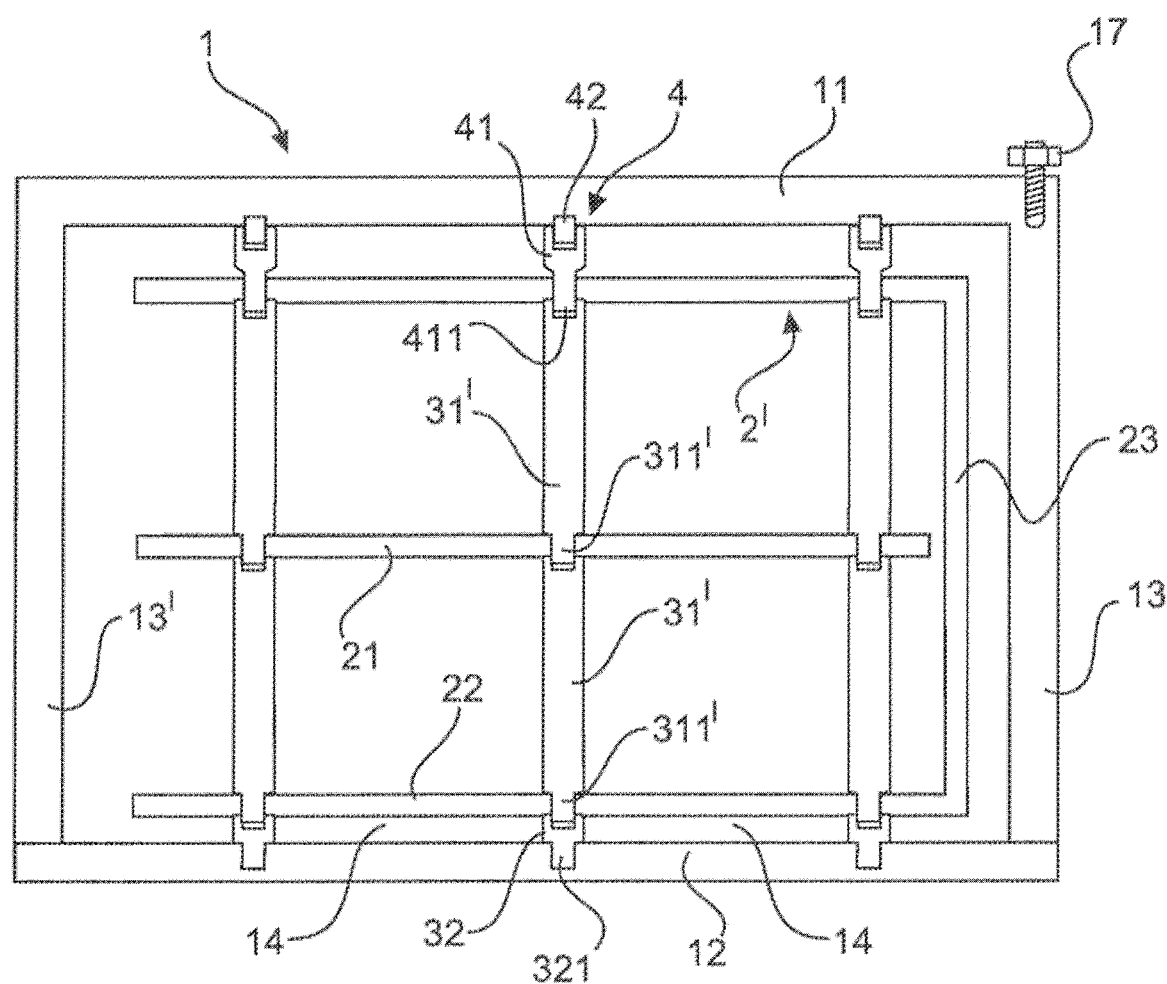
Figure 4:
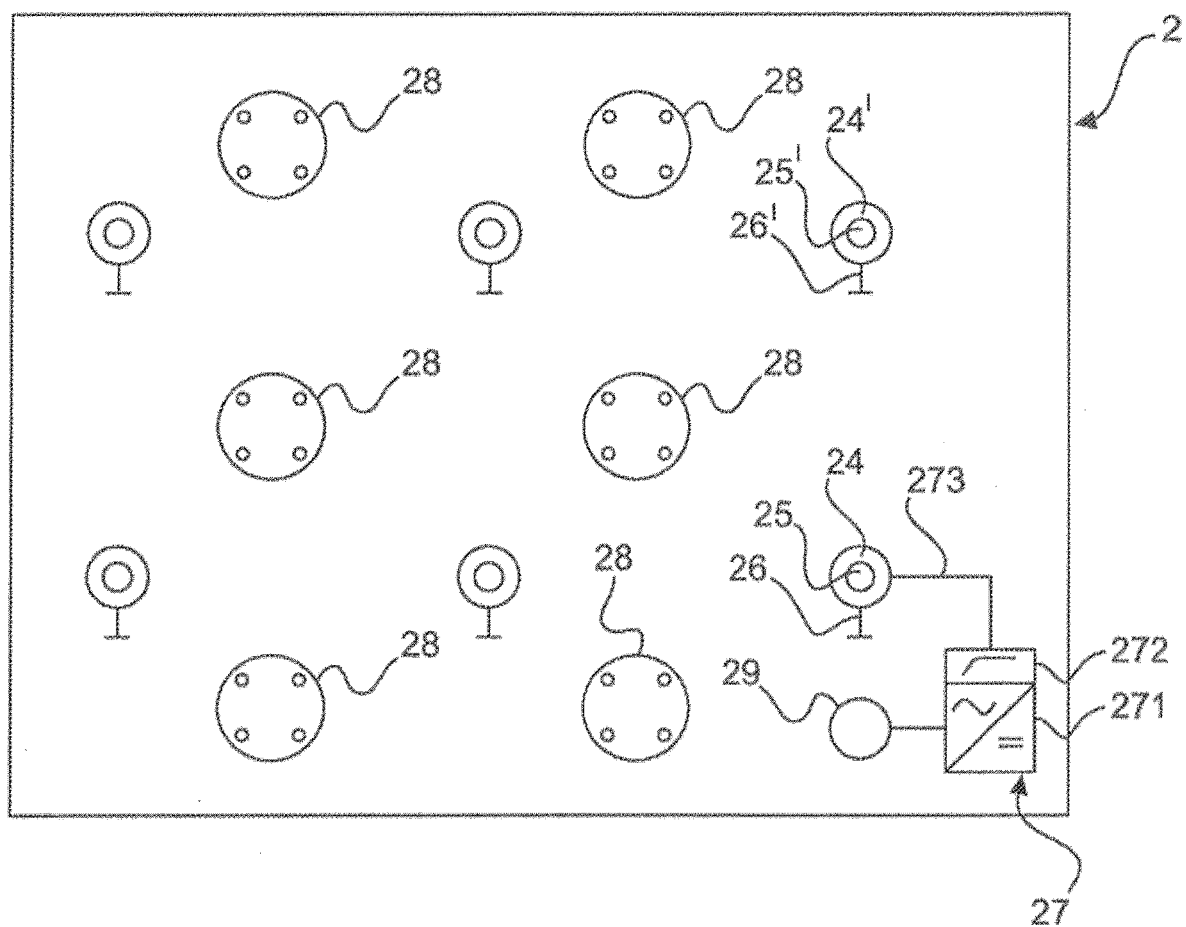

An exemplary embodiment of the invention is illustrated in the drawings and will be explained in more detail below. The drawings show:

FIG. 1a a frame with two printed circuit boards and a stabilizing element in a first embodiment;

FIG. 1b the frame with a folded printed circuit board and the stabilizing element;

FIG. 2a the frame with three printed circuit boards and a modified stabilizing element;

FIG. 2b the frame with a folded and a further printed circuit board and the modified stabilizing element;

FIG. 3 a, b a plug connection comprising two connecting parts in the unplugged and in the plugged-in state;

FIG. 3 c, d the above-mentioned plug connection in cross-section through the connecting parts;

FIG. 3 e, f the plug connection with a tulip-head bolt as the first connecting part;

FIG. 4 the printed circuit board with through-openings and ground contacts arranged thereon;

FIG. 5 a, b a frame in a second embodiment in an angled plan view, looking into a front-side opening;

FIG. 6 a, b the frame in cross-section through the connecting parts without and with two printed circuit board assemblies.

The figures contain partially simplified, schematic illustrations. For the connecting part, identical reference signs are used for elements which are similar, but possibly not identical. Varying views of similar elements could be drawn to different scales.

FIG. 1a shows a schematic illustration of a frame 1 with a device base side 12 and an upper part which can be connected thereto, comprising a device connection side 11, two side parts 13, 13' and a grounding screw 17.

A printed circuit board 2 is arranged in the vicinity of the device connection side 11 and, by means of its ground connections 24, 24', which are illustrated in FIG. 4, electrically conductively connected to the device connection side 11 via plug connections having a variable insertion depth.

These plug connections 4 are each formed by a first connecting part 41 and a second connecting part 42. The device connection side 11 has cylindrical bores in which the second connection parts 42, which are constructed in the form of clamping pins in the present example, are fastened with force fit. The first connecting parts 41, on the other hand, each have a respective threaded pin 411 on the base side. By means of these threaded pins 411, they are guided through through-openings 25, 25' in the printed circuit board 2, which are arranged at the ground connections 24, and each screwed into a stabilizing element 3. By way of example, this construction comprises six stabilizing elements 3, although only three of these can be seen in this sectional illustration. The stabilizing elements 3 are each formed by a plurality of screwed-together screw bolts 31, 32, namely by a long screw bolt 31 and a short screw bolt 32 in this case.

The device base side 12 has a plurality of cylindrical bores, each having an internal thread, although these are not provided with a reference sign for the sake of clarity. One of the short screw bolts 32 is screwed in each case into each of these threaded bores by means of its threaded pin 321. These threaded pins 321 each have a threaded bore at their opposite end, into which the long screw bolt 31 is in turn screwed by means of its threaded pin 311 after it has previously been guided through a through-opening in a further printed circuit board 22. If the circuit design lends itself to this, the further printed circuit board 22 can also have ground contacts at at least some of its through-openings. Alternatively, the screw connection on the stabilizing element merely serves for the mechanical fastening thereof.

The spacing between the further printed circuit board 22 and the device base side 12 is therefore fixedly predetermined. For thermal reasons, this further printed circuit board 22 is arranged very close to the device base side 12, for example at a spacing of 1 mm. A clearance 14, which can be used for example for including heat-conducting elements (not illustrated in the drawing), remains between the further printed circuit board and the device base side. The further printed circuit board 22 is finally provided for receiving particularly power-intensive electronic components and, as a result of its geometric proximity to the device base side 12, can dissipate the generated heat very effectively, in particular using the said heat-conducting elements, which are not illustrated in the drawing for the sake of clarity.

According to the present design, this requirement also determines the spacing between the printed circuit board 2, arranged in the vicinity of the device connection side, and the device base side 12. Since the dimensions of the further frame components (represented merely symbolically by the side parts 13, 13' in this schematic illustration) essentially vary from device to device within certain tolerance ranges, the plug connection having a variable insertion depth 4 in the arrangement described is suitable for enabling direct ground contacting between the printed circuit board 2 and the device connection side 11. An electrical disturbance can thus ultimately be discharged along the virtually shortest path to the grounding screw 17.

FIG. 1b differs from the previous illustration merely in that a folded printed circuit board 2' is used. The folded printed circuit board 2' is notable in that it possesses a folded area which, in this case, is formed by the lateral 23 and the lower 22' subarea of the printed circuit board. In particular, this determines the spacing of the printed circuit board 2' from the device base side 12, namely owing to the shape of the folded area comprising at least the lower subarea 22', which corresponds in functional terms to the further printed circuit board 22 from the previous illustration, and additionally also the lateral subarea 23.

A power supply unit 27, for example, can be arranged on the lateral subarea 23.

FIG. 2a shows an arrangement in which, compared to the arrangement from FIG. 1a, an additional further printed circuit board 21 has been added. Accordingly, the long screw bolt 31 is replaced by two medium screw bolts 31', which are screwed together and, as already described, jointly to the short threaded bolt 32, by means of their threaded pins 311' and thereby fasten the further printed circuit boards 21, 22 at their through-openings and possibly establish electrical contact therewith at their ground connections.

In FIG. 2b, an arrangement is shown in which the folded printed circuit board 2' is combined accordingly with the further printed circuit board 21 so that a stacked structure is also generated here, which, in functional terms, is comparable to the arrangement described above.

FIGS. 3a and 3b illustrate the plug connection 4 in an enlarged view. In two phases, it is shown how the two connecting parts 41, 42 are connected to one another.

FIGS. 3c and 3d illustrate this procedure in a cross-section through the connecting contacts 41, 42.

The first connecting part 41 possesses a plug area 414 having a substantially cylindrical recess into which the second connecting part 42, which, in this construction, is a clamping pin fastened in the device connection side 11, is received with force fit. In addition to its plug area 414, the first connecting part 41 also possesses a base area 412 having a threaded pin 411 which has an external thread 413 by means of which the first connecting part 411 is screwed into a threaded bore (not referenced in more detail) of one of the screw bolts 31 of the stabilizing element 3. The printed circuit board 2 is thus also fastened to the stabilizing element 3 and, by means of its ground contact 24, is in electrical contact at least with the first connecting part 41 and is electrically conductively connected to the device connection side 11 by the plug connection having the variable insertion depth 4 in the plugged-in state.

Figure 3E:
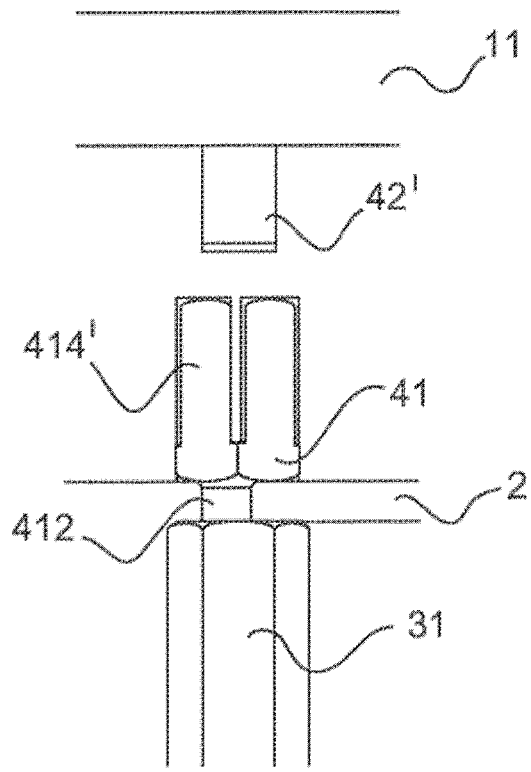
Figure 3F:
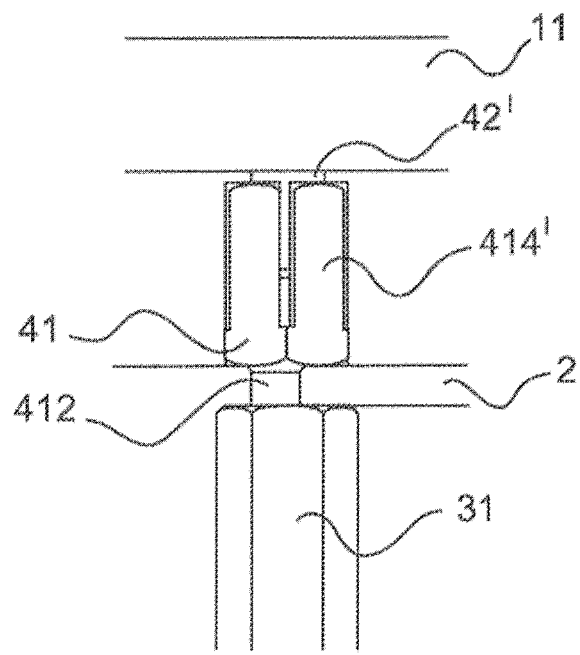

FIGS. 3e and 3f show, in a comparable illustration, a first connecting element 41, which has a slot extending in the plug-in direction on the plug side and is therefore constructed as a tulip-head bolt. Thus, in this variant, the first connecting element 41 has an elastic deformability perpendicularly to the plug-in direction. The printed circuit board 2 in this illustration is illustrated in section so that a thread-free portion of the base area 412 of the first connecting part 41 is also visible.

FIG. 4 shows the printed circuit board 2 in a plan view. In this case, by way of example, six insulating bodies 28 of individual plug connectors—in the present case these are circular plug connectors, e.g. M12 plug connectors—are integrated in the printed circuit board 2. Six ground contacts 24, 24' with symbolically indicated ground connections 26, 26' are furthermore also shown, which, in practice, can correspond to an individual circuit design which is not described in more detail here.

Furthermore, a power connection 29 having a power supply unit 27 connected thereto is arranged on the printed circuit board. The power supply unit comprises a rectifier 271 and an electrical filter 272, via which high-frequency disturbances are conducted to the ground contact 24, for example, via a ground wire 237.

Arranged within each ground contact 24, 24' is the said through-opening 25, 25' through which the respective first connecting part 41 is screwed on the base side and can at the same time be contacted at the ground contact 24, 24'.

Of course, depending on the circuit design, disturbances can also occur at other points in the printed circuit board 2, 2' and be discharged at the grounding screw 17 over comparatively short paths via the corresponding ground contacts 24'.

FIGS. 5a, 5b, 6a, 6b show an arrangement which is comparable to FIG. 1b in an embodiment which is less schematic, and therefore has greater practical relevance. In the illustrations in FIGS. 5a to 6a, the printed circuit board 2' has been removed here for the sake of clarity. The stabilizing element 3, comprising a long screw bolt 31 and a short screw bolt 32, is thus clearly shown in FIGS. 5a and 5b.

Figure 5A:
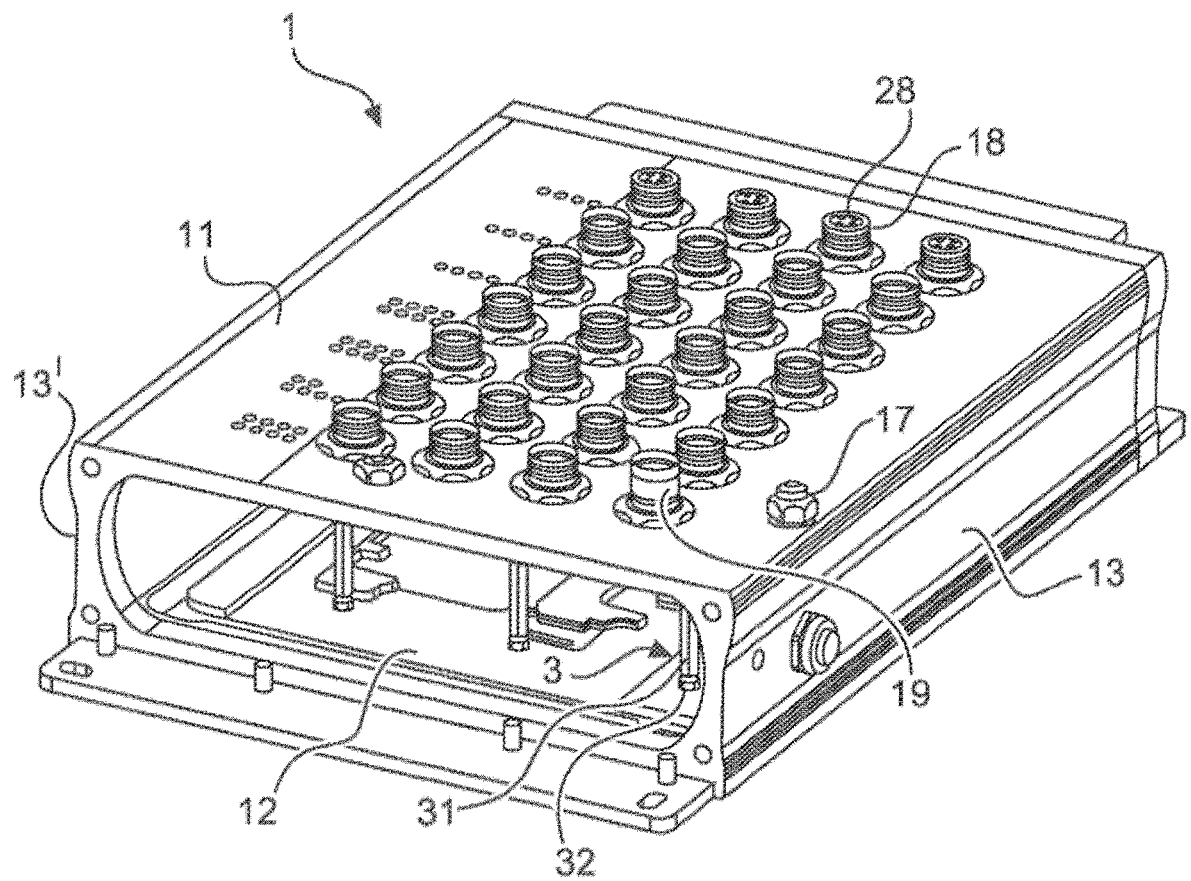

FIG. 5a shows the frame 1 in an angled plan view. The frame 1 possesses an upper part, comprising the device connection side 11 and the two side parts 13, 13'. The device base side 12, on which the upper part can be seated and fastened thereto, is arranged parallel to and opposite the device connection side 11. A front side (not shown) which can be screwed on is removed for this illustration to enable a view inside the frame 1.

A multiplicity of screw-in sleeves 18 of the circular plug connectors are arranged in the device connection side 11. Indicated in the row illustrated at the back are the associated insulating bodies 28 which are arranged on the printed circuit board 2' and enter the corresponding screw-in sleeves 18 in a flexible manner and thus likewise enable a tolerance compensation of the frame 1.

The power connection 19 is arranged in the vicinity of the grounding screw 17.

Figure 5B:
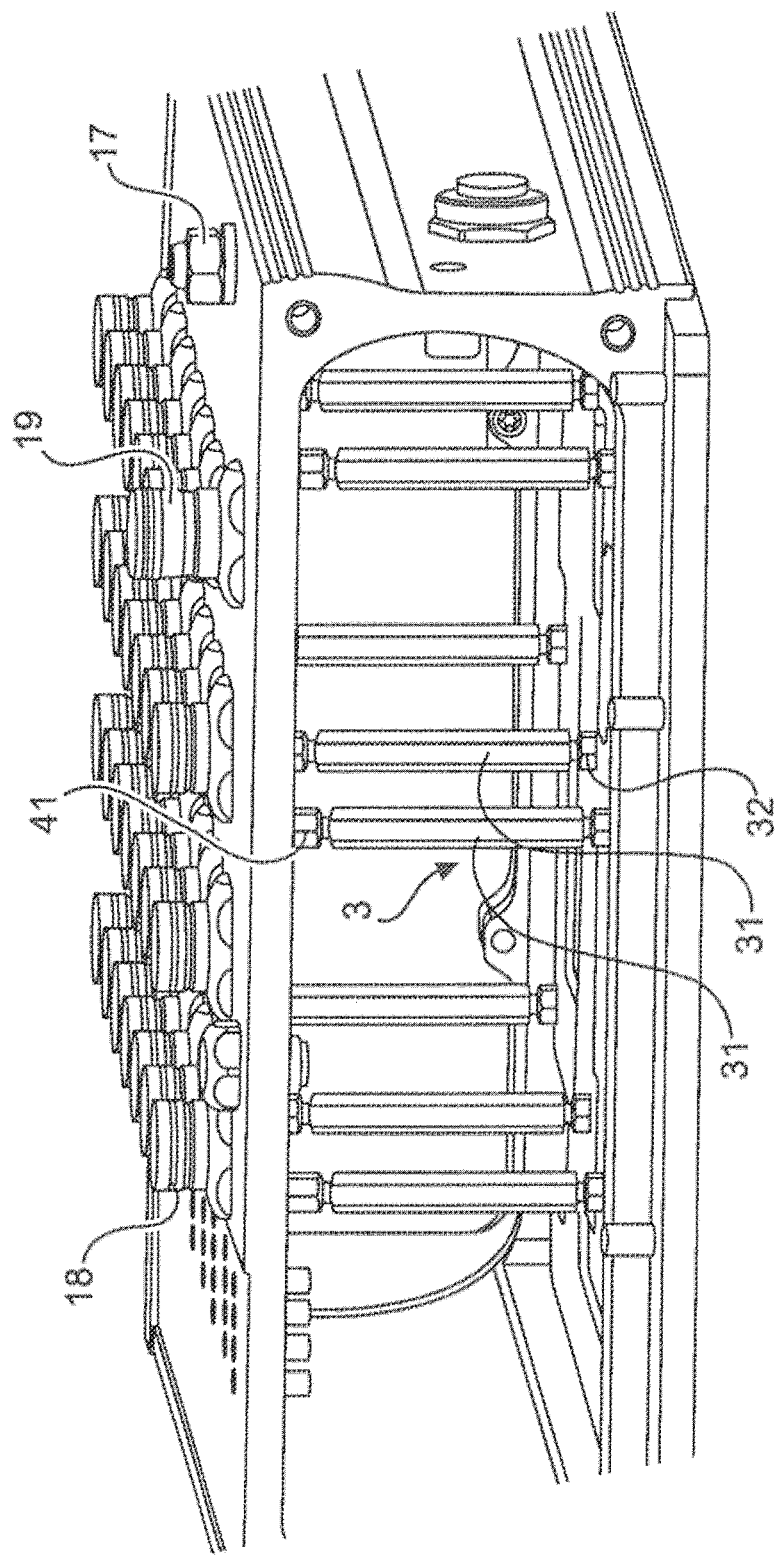

FIG. 5b shows the same arrangement on an enlarged scale from a somewhat lower perspective. In particular, the first connecting parts 41 can also be seen in this case.

Figure 6A:
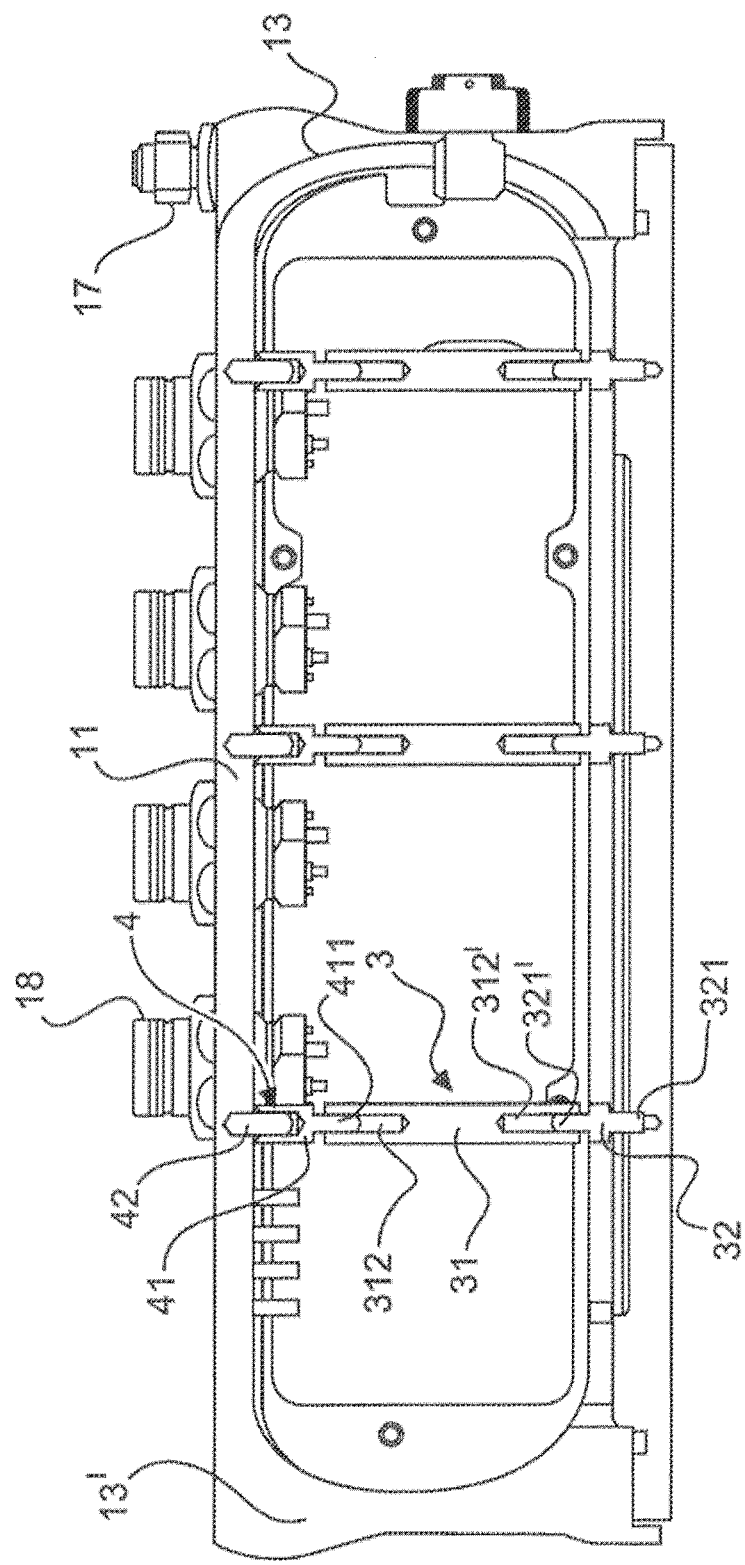

FIG. 6a shows the arrangement in a cross-section through the connecting parts 41, 42 and the stabilizing elements 3 in the form of the screw bolts 31, 32 screwed into one another. In this embodiment, the short screw bolt 32 possesses two threaded pins 321, 321' and the long screw bolt 31 possesses two threaded recesses 312, 312'.

Figure 6B:
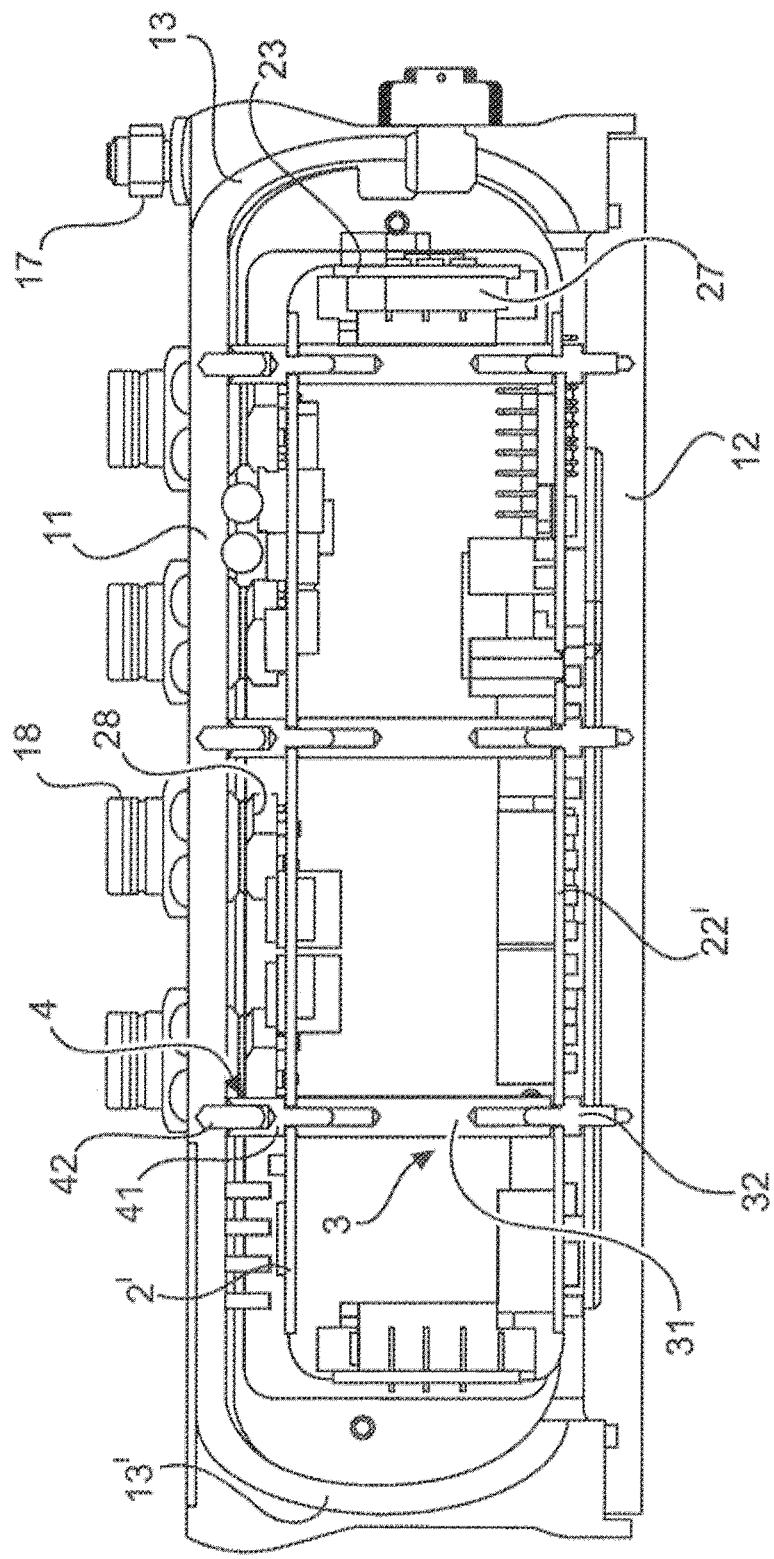

FIG. 6b shows this arrangement with the folded printed circuit board 2'. In this arrangement, the power supply unit 27 is arranged on the lateral subarea 23, but in the vicinity of the grounding screw 17 and the power connection 19, which is not visible in this sectional illustration.

The plug area 414 of the first connecting part 41 has a hollow cylindrical construction and the second connecting part 42 is a clamping pin.

This design is furthermore also particularly advantageous for the automated production of corresponding electrical devices since, by assembling the device, i.e. in this case seating the frame upper part, comprising the device connection side 11 and the side parts 13, 13', on the device base side 12, the ground contacting of the printed circuit board 2' also takes place automatically and, more precisely, in the manner desired, as an advantageous meshed grounding, with simultaneously enabled compensation of the frame tolerances by means of a plug connection having a variable insertion depth 4.

LIST OF REFERENCE SIGNS

1 Frame
11 Device connection side
12 Device base side
13, 13' Side parts
14 Space for thermal conductive elements (not illustrated)
17 Grounding screw
18 (Screw-in) sleeves of individual plug connectors
19 Power connection
2, 2' Printed circuit board, folded printed circuit board
21, 21',22 Further printed circuit boards,
22' Folded area/lower subarea of the folded printed circuit board
23 Lateral subarea of the folded printed circuit board
24, 24' Ground contact
25, 25' Through-opening
26, 26' Ground connection
27 Switching power supply unit
271 Switching power supply unit/rectifier
272 Electronic filter
273 Ground wire/ground track
28 Insulating body of individual plug connectors (e.g. M12)
29 Power connection
3 Stabilizing element
31 Long screw bolt
31' Medium screw bolt
32 Short screw bolt
311, 311', 321 Threaded pins of the screw bolts
4 Plug connection having a variable insertion depth
41 First connecting part
411 Threaded pin of the first connecting part
412 Base area of the first connecting part
413 Thread of the first connecting part
414 Plug area of the first connecting part
42, 42' Second connecting part

The invention claimed is:

1. An arrangement for the ground connection of a printed circuit board to a frame of an electrical device, comprising the frame, which consists at least partially of an electrically conductive material, the printed circuit board, which has at least one ground contact, and at least one ground connection for the electrically conductive connection of the at least one ground contact of the printed circuit board to the frame, wherein the at least one ground connection is formed in each case by a plug connection having a variable insertion depth, wherein the plug connection comprises a first connecting part and a second connecting part, which can be connected to one another with force fit, but such that they are displaceable within a predetermined range, for mutual electrical contacting.

2. The arrangement as claimed in claim 1, wherein the first connecting part possesses a base area at one end and, opposite, a plug area, wherein the base area is arranged on the at least one ground contact of the printed circuit board and electrically conductively connected thereto.

3. The arrangement as claimed in claim 2, wherein either the first connecting part is configured to be socket-shaped in its plug area and the second connecting part fulfills the function of a pin contact opposite the first connecting part; or the second connecting part is configured to be socket-shaped in its plug area and the first connecting part fulfills the function of a pin contact opposite the second connecting part.

4. The arrangement as claimed in claim 2, wherein the printed circuit board has a through-opening at its at least one ground contact, through which the first connecting part can be mechanically fastened to a stabilizing element on the base side.

5. The arrangement as claimed in claim 4, wherein the stabilizing element is a plurality of screwed-together screw bolts and in that at least two of these screw bolts are screwed together through at least one further through-opening of a folded area of the printed circuit board and/or at least one further printed circuit board in order to mechanically fasten the folded area and/or the further printed circuit board.

6. The arrangement as claimed in claim 5, wherein the folded area of the printed circuit board and/or the at least one further printed circuit board has a further ground contact at at least one of the said further through-openings so that it also possesses further ground contacting via the stabilizing element (3) and the plug connection in addition to the mechanical fastening.

7. The arrangement as claimed in claim 5, wherein the stabilizing element is secured to a device base side of the frame and in that the second connecting part is electrically conductively secured to a device connection side of the frame, wherein the device connection side is parallel to and opposite the device base side.

8. The arrangement as claimed in claim 7, wherein the frame has a respective cylindrical recess for securing each stabilizing element and each second connecting part in the device base side and in the device connection side, and in that at least those recesses which are arranged in the device base side each have an internal thread in order to screw a threaded pin of the respective stabilizing element therein.

9. The arrangement as claimed in claim 1, wherein at least one of the two connecting elements is elastically deformable at least on the plug side.

10. The arrangement as claimed in claim 9, wherein one of the two connecting elements is a tulip-head bolt and/or in that one of the two connecting elements is a clamping pin or a clamping sleeve.

11. The arrangement as claimed in claim 3, wherein the printed circuit board has a through-opening at its at least one ground contact, through which the first connecting part can be mechanically fastened to a stabilizing element on the base side.

12. The arrangement as claimed in claim 11, wherein the stabilizing element is a plurality of screwed-together screw bolts and in that at least two of these screw bolts are screwed together through at least one further through-opening of a folded area of the printed circuit board and/or at least one further printed circuit board in order to mechanically fasten the folded area and/or the further printed circuit board.

13. The arrangement as claimed in claim 6, wherein the stabilizing element is secured to a device base side of the frame and in that the second connecting part is electrically conductively secured to a device connection side of the frame, wherein the device connection side is parallel to and opposite the device base side.

14. The arrangement as claimed in claim 13, wherein the frame has a respective cylindrical recess for securing each stabilizing element and each second connecting part in the device base side and in the device connection side, and in that at least those recesses which are arranged in the device base side each have an internal thread in order to screw a threaded pin of the respective stabilizing element therein.

15. A method for the ground connection of a printed circuit board to an at least partially electrically conductive frame of an electrical device, characterized by the following steps:
 a.) securing at least one stabilizing element by its first end to a device base side of the frame;
 b.) mechanically connecting the at least one stabilizing element at its second end to the printed circuit board;
 c.) securing at least one first connecting part to the at least one stabilizing element with simultaneous fastening of the printed circuit board between the at least one connecting part and the at least one stabilizing element, whilst simultaneously establishing electrical contact between at least one ground contact of the printed circuit board and the at least one first connecting part;
 d.) securing at least one second connecting part to a device connection side of the frame;
 e.) mechanically assembling the frame and simultaneously automatically electrically conductively connecting the frame to the at least one ground contact of the printed circuit board via at least one plug connection having a variable insertion depth, comprising the at least one first and the at least one second connecting part, whilst simultaneously mechanically compensating deviating frame dimensions within a predetermined tolerance range by correspondingly adapting the insertion depth of the plug connection between the at least one first and the at least one second connecting part.

16. The method as claimed in claim 15, wherein, in method step a.), the securing of the stabilizing element to the device base side takes place by screwing a threaded pin of the stabilizing element into a threaded bore of the device base side, wherein the stabilizing element is produced by screwing a plurality of screw bolts together.

17. The method as claimed in claim 16, wherein, when screwing the plurality of screw bolts together, in each case one screw bolt is guided by its threaded pin through at least one through-opening, which is arranged in a folded area of the printed circuit board and/or in at least one further printed circuited board, and is screwed to a threaded bore of a further screw bolt, whereby the folded area of the printed circuit board and/or the at least one further printed circuit board is also mechanically fastened between these two screw bolts on the stabilizing element and therefore relative to the device base side.

18. The method as claimed in claim 17, wherein, when screwing the plurality of screw bolts of least one stabilizing element together, at least one of the screw bolts is mechanically and electrically conductively connected to at least one further ground contact, which is arranged in the folded area of the printed circuit board, and/or in the at least one further printed circuit board, at the associated through-opening.

* * * * *